(12) United States Patent
Fartash

(10) Patent No.: US 7,445,810 B2
(45) Date of Patent: Nov. 4, 2008

(54) METHOD OF MAKING A TANTALUM LAYER AND APPARATUS USING A TANTALUM LAYER

(75) Inventor: Arjang Fartash, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 493 days.

(21) Appl. No.: 10/825,841

(22) Filed: Apr. 15, 2004

(65) Prior Publication Data

US 2005/0233159 A1    Oct. 20, 2005

(51) Int. Cl.
*B05D 3/00*     (2006.01)
*B05D 5/00*     (2006.01)
*B32B 15/04*    (2006.01)
*B05B 1/00*     (2006.01)
*B41J 2/135*    (2006.01)
*C23C 30/00*    (2006.01)

(52) U.S. Cl. .................. 427/123; 427/124; 428/662; 428/220; 428/218; 428/332; 428/700; 29/890.142; 239/602; 347/20

(58) Field of Classification Search ................ 428/660, 428/662, 596, 604, 34.1, 34.4, 687, 220, 428/218, 332, 688, 700, 699; 427/123, 124, 427/126.1; 29/890.142; 239/DIG. 19, 602; 347/6, 9, 17, 18, 20, 85
See application file for complete search history.

(56) References Cited

U.S. PATENT DOCUMENTS 4,364,099 A * 12/1982 Koyama et al. ............. 361/305
5,140,403 A     8/1992  Hikichi
5,221,449 A *  6/1993  Colgan et al. .......... 204/192.15
5,274,482 A * 12/1993  Morita et al. .................. 349/51
6,488,823 B1  12/2002  Chiang
2003/0124262 A1*  7/2003  Chen et al. .................. 427/404
2003/0207209 A1  11/2003  Patil
2004/0131878 A1   7/2004  Seet

FOREIGN PATENT DOCUMENTS

| EP | 0 487 055 | 5/1992 |
| JP | 03248568 | 11/1991 |
| JP | 04 318934 | 11/1992 |
| JP | 07 226507 | 8/1995 |
| JP | 09213961 | 8/1997 |
| JP | 09 306334 | 11/1997 |
| JP | 2004525257 | 8/2004 |
| WO | WO 2004/099461 | 11/2004 |

OTHER PUBLICATIONS

DW Face and DE Prober, J. Vac. Sci. Technol. A, vol. 5, No. 6, Nov./Dec. 1987, "Nucleation of body-centered-cubic tantalum films with a thin niobium underlayer", pp. 3408-3411.

DW Face, ST Ruggiero, and DE Prober, J. Vac. Sci. Technol. A, vol. 1, No. 2, Apr.-Jun. 1983, "Ion beam deposition of Nb and Ta refractory superconducting films", pp. 326-330.

DW Matson, MD Merz, and ED McClanahan, J. Vac. Sci. Technol. A. vol. 10, No. 4, Jul./Aug. 1992, "High rate sputter deposition of wear resistant tantalum coatings", pp. 1791-1796.

* cited by examiner

*Primary Examiner*—Michael La Villa

(57) ABSTRACT

A method of making tantalum structures, including, creating a tantalum layer disposed on a first layer region of a first layer and on a second layer region of a second layer. The tantalum layer has a substantially bcc-phase tantalum region on the first layer region, and a non-bcc-phase tantalum region on the second layer region.

56 Claims, 4 Drawing Sheets

METHOD OF MAKING A TANTALUM LAYER AND APPARATUS USING A TANTALUM LAYER

BACKGROUND

Description of the Art

Tantalum films are important in a number of applications such as thin film capacitors, resistors, metal interconnects in semiconductor devices, superconducting tunnel junctions, and cavitation barriers for thermal ink jet cartridges. The chemical stability and excellent mechanical properties of tantalum make it a particularly desirable material. The refractory nature of tantalum, as well as its resistance to chemical attack and corrosion makes it of particular interest in both electronic and micro-electro-mechanical (MEMs) devices. For example, in semiconductor integrated circuit manufacturing, tantalum may be used as a diffusion barrier between copper and silicon. Tantalum also may be used as a gate electrode in metal oxide semiconductor field effect transistor (MOSFET) devices. In addition, tantalum may be utilized to absorb X-rays in X-ray masks.

It is well known that tantalum films may be produced in two different cyrstallographic phases, body-centered-cubic (bcc), commonly referred to as alpha tantalum (α-phase), and tetragonal, commonly referred to as beta tantalum (β-phase). Typically, the deposition of a high quality bcc tantalum film requires high quality vacuum systems having pressures less than $10^{-7}$ Torr, high deposition rates of greater than 1 nanometer per second, and elevated substrate temperatures of greater than 300° C. On the other hand, β-phase tantalum generally is formed at higher pressures, lower deposition rates, and lower substrate temperatures. The ability to form both phases of tantalum under a common set of conditions will open up a wide variety of applications that are currently either impractical or are not cost effective.

DESCRIPTION OF THE PREFERRED EMBODIMENTS

This invention is directed to various apparatuses utilizing tantalum films. The present invention provides a method of fabricating a wide variety of devices that include bcc-phase or alpha tantalum structures incorporated into the device where both phases have a residual compressive stress. In addition, the present invention also provides a method of forming a single sheet of tantalum in which the structural phase of tantalum is laterally switched (i.e. "switching-phase-tantalum") between α-phase tantalum and β-phase tantalum at length scales in the nanometer range. Further, alpha or bcc-phase tantalum has a thermal conductivity an order of magnitude higher than β-phase tantalum, thus, the present invention provides a convenient method of generating surface temperature gradients by spatially controlling the phase of tantalum deposited over lateral length scales in the nanometer range.

It should be noted that the drawings are not true to scale. Further, various elements have not been drawn to scale. Certain dimensions have been exaggerated in relation to other dimensions in order to provide a clearer illustration and understanding of the present invention. In addition, although some of the embodiments illustrated herein are shown in two dimensional views with various regions having depth and width, it should be clearly understood that these regions are illustrations of only a portion of a device that is actually a three dimensional structure. Accordingly, these regions will have three dimensions, including length, width, and depth, when fabricated on an actual device.

Figure 1:
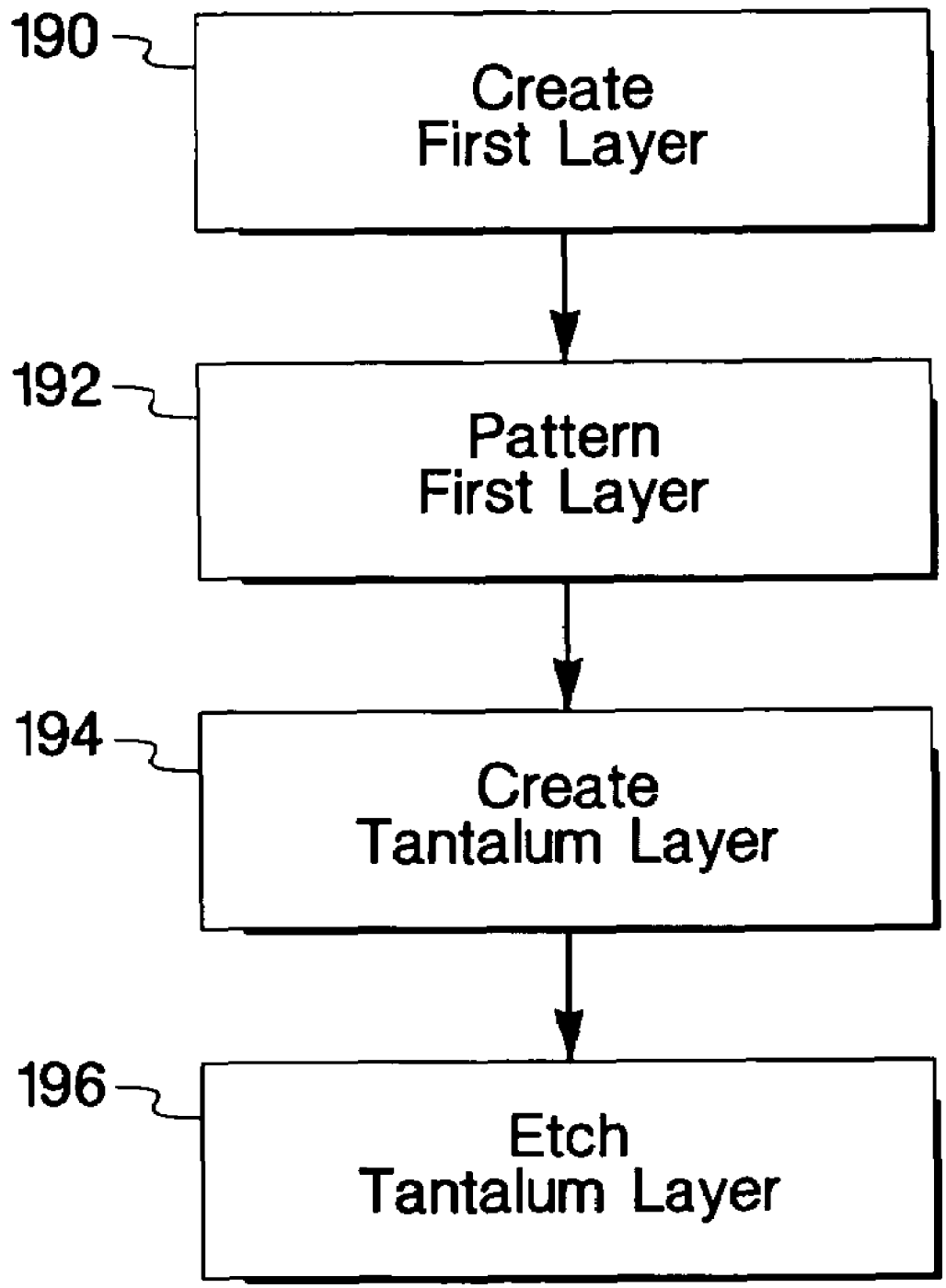
FIG. 1 is a flow chart of a process used to create a tantalum layer according to an embodiment of the present invention.

FIG. 1 is a process flow chart illustrating a process used to create embodiments of the present invention. FIGS. 2a-2d are illustrations of the processes utilized to create a tantalum layer according to embodiments of the present invention. First layer creation process 190 is utilized to create a bcc-phase-tantalum forming first layer 222 as part of apparatus 200 as shown in a cross-sectional view in FIG. 2a. In this embodiment, bcc-phase-tantalum forming first layer 222 is formed on second layer 220. The particular process used will depend on the particular material utilized to form the bcc-phase-tantalum forming first layer, as well as the particular 2nd layer utilized. In this embodiment, bcc-phase-tantalum forming first layer 222 may be formed utilizing materials such as niobium, titanium, aluminum, nitrides of these metals, tantalum nitride, or any other suitable material that promotes creation of the α-phase of tantalum. In addition, bcc-phase-tantalum forming first layer 222 may be formed using conventional thin film deposition processing equipment utilizing physical or chemical vapor deposition technologies. For example, in those embodiments utilizing niobium as the bcc-phase-tantalum forming first layer, sputter deposition or evaporation systems (both thermal and electron beam evaporation) may be utilized. In alternate embodiments, for example, utilizing titanium or aluminum as the first layer, chemical vapor deposition (CVD) including atmospheric (APCVD), low pressure (LPCVD), or plasma enhanced (PECVD) variants also may be utilized. In still other embodiments, other film creating processes such as electro or electroless deposition, laser ablation, and thick film deposition techniques may be utilized. Generally, bcc-phase-tantalum forming first layer 222 may have a thickness greater than about 15 nanometers; however, in alternate embodiments, thicknesses as low as about 1 nanometer also may be utilized. In still other embodiments, utilizing atomically smooth surfaces bcc-phase-tantalum forming first layer 222 may be as thin as a single monolayer. The particular thickness utilized will depend on various factors such as the particular deposition technique used as well as on the particular material on which the first layer is being deposited. Generally, the minimum thickness will be the thickness of the first layer material that forms a continuous layer in the regions desired and under the deposition conditions utilized.

Second layer 220 may be formed from a wide range of materials including ceramics, glasses, metals and alloys, various semiconductor materials, and plastics. The actual second layer material utilized will depend on various system components such as the particular environment to which the device or apparatus will be subjected, the presence or absence of active devices, the expected lifetime of the apparatus or device as well as the application in which the device or apparatus will be used. In an alternate embodiment, additional layers may be disposed between second layer 220 and first layer 222 depending on the particular device being formed. For example, a reactive metal tie layer may be utilized to improve the adhesion of the first layer to the underlying material of the second layer 220. Examples of various tie layers include chromium, titanium or other reactive metal thin film which may be deposited prior to the deposition of the first layer material. An optional surface pretreatment such as wet chemical etching or modification or plasma modification of the surface to further improve adhesion also may be utilized.

Figure 2A:
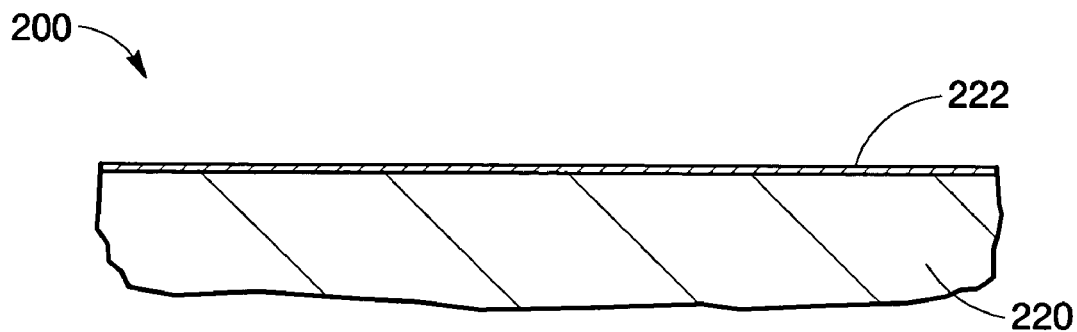
FIG. 2a to 2d are cross-sectional views of various processes used to create a tantalum layer according to an embodiment of the present invention.
Figure 2B:
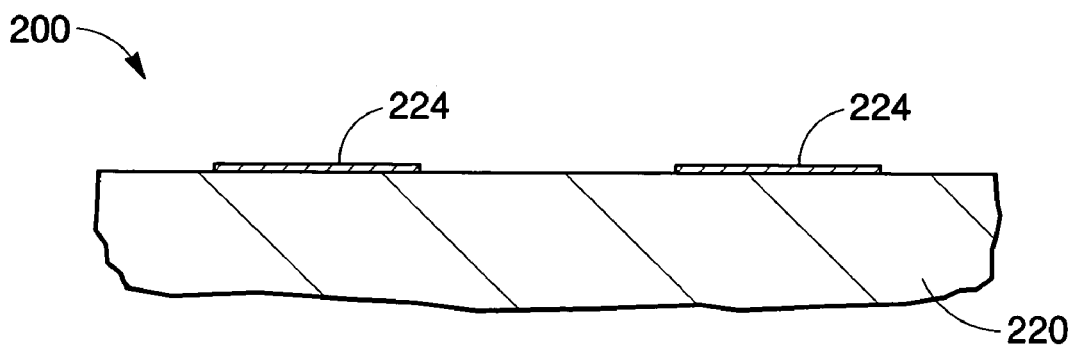

First layer patterning process 192 is utilized to define the location and lateral shape of bcc-phase-tantalum forming first layer 222 to form first layer structures or bcc-phase-tantalum forming regions 224 as illustrated in FIG. 2b. Generally first layer patterning process 192 utilizes etching and photolithography or circuit board processing systems to form bcc-phase-tantalum forming regions 224 on second layer 220 of apparatus 200. Both subtractive, as illustrated in FIG. 2b, and additive processes may be utilized in the present invention. For those embodiments utilizing a subtractive process generally after first layer 222 is formed a photoresist is spin coated over the first layer followed, typically, by a low temperature soft bake to remove volatile solvent, then exposed, developed, and subsequently baked at a higher temperature to harden the resist material. In alternate embodiments, other coating techniques such as spray coating or curtain coating also may be utilized. In addition, techniques such as screen printing as well as lamination of a what is generally referred to as a solder mask also may be utilized and are particularly desirable in those applications utilizing larger structures that do not require photolithographic type processing. Generally after the photoresist pattern has been formed, the first layer, in those areas no longer covered by the photoresist, is etched utilizing wet chemical or plasma etches or combinations thereof. For example, a niobium first layer may be sputter deposited and later etched utilizing a chlorine reactive ion etch.

In one embodiment a 20 nanometer thick niobium first layer was sputter deposited by dc magnetron sputtering utilizing an argon pressure of 2.5 milliTorr (mTorr), with a flow rate of 50 sccm (flow of Standard gas at a pressure of one atmosphere at a rate of one Cubic Centimeter per Minute) and a power of 1 kilo-Watt (kW). In alternate embodiments, plasma powers in the range from about 500 W to about 1.5 kW also may be utilized, as well as other deposition techniques known in the art. After patterning of the photoresist was completed the niobium layer was then dry etched at a pressure of about 20 mTorr using an argon, chlorine, and carbon tetrafluoride mixture at flow rates of 10, 40, and 10 sccm respectively, a radio frequency (RF) power of 800 W applied to the upper electrode and 10 W applied to the lower electrode, and a substrate (i.e. lower electrode) temperature of about 75° C. In still another alternate embodiment, the niobium first layer may be etched at a pressure of 15 mTorr using chlorine gas at a flow rate of 120 sccm and an RF power of about 50 W applied to the lower electrode and about 400 W applied to the upper electrode. In still other embodiments, various wet etches as well as other dry etches also may be utilized to pattern the niobium first layer.

In a second embodiment, a 20 nanometer titanium first layer was deposited by dc magnetron sputtering at an argon pressure of 2.5 mTorr, with a flow rate of 50 sccm and a power of 1.5 kW. In alternate embodiments, plasma powers in the range from about 1.5 kW to about 3 kW also may be utilized, as well as other deposition techniques known in the art. After patterning of the photoresist was completed the titanium layer was then dry etched at a pressure of about 15 mTorr using chlorine at a flow rate of 120 sccm, an RF power of 400 W applied to the upper electrode and 50 W applied to the lower electrode, and a substrate temperature of about 50° C. In still other embodiments, various wet etches as well as other dry etches also may be utilized to pattern the titanium first layer.

In a third embodiment, a 40 nanometer aluminum first layer was deposited by dc magnetron sputtering at an argon pressure of 2.5 mTorr, with a flow rate of 50 sccm and a plasma power of 5 kW. In alternate embodiments, other plasma powers also may be utilized, as well as other deposition techniques known in the art. After patterning of the photoresist was completed the aluminum layer was then wet etched utilizing an etchant solution having 16 parts phosphoric acid, 9 parts nitric acid, 1 part acetic acid, and two parts water. In alternate embodiments other wet etches as well as dry etches also may be utilized to pattern the aluminum first layer.

After the first layer has been etched the photo resist may then be removed utilizing any of a wide variety of wet chemical or dry etches known in the art. In still other embodiments, various other patterning techniques such as focussed ion beam milling, or laser ablation also may be utilized to pattern bcc-phase-tantalum forming first layer 222 and form first layer regions 224. For those embodiments utilizing an additive or lift-off process generally a photoresist or solder mask film is applied to the surface onto which the first layer is to be formed utilizing the same or similar processes as those described above for the subtractive process. In an additive process the photoresist is patterned to provide openings in those areas where the first layer is desired and to leave covered those areas where no first layer should be deposited. Generally, the photoresist pattern formed in an additive process has re-entry photoresist sidewall profiles in the opening regions of the photoresist. After the desired pattern is formed in the photoresist layer the bcc-phase or α-tantalum forming first layer is formed over the remaining photoresist layer and on surface exposed by the openings in the photoresist layer. Subsequently the photo resist layer is processed through a photoresist removal process that lifts off the resist and unwanted first layer deposited thereon. Generally such a process may be assisted by ultrasonic agitation. After the photoresist is removed the desired pattern of the first layer is left on the surface.

Figure 2C:
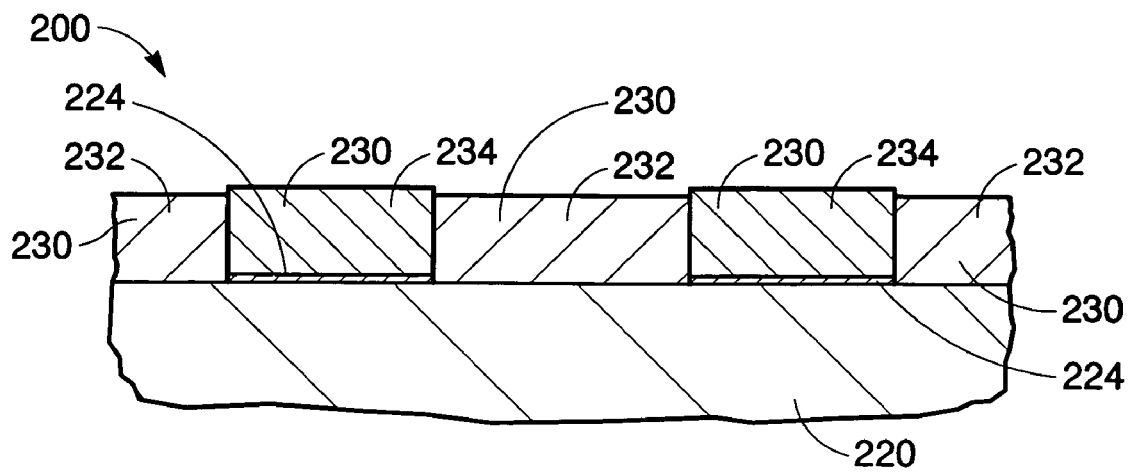

Tantalum layer creation process 194 is utilized to create a tantalum layer over the surface exposed regions, and over the patterned first layer regions of apparatus 200 as illustrated in FIG. 2c. In this embodiment, tantalum layer 230 includes β phase or non-bcc-phase tantalum regions 232 formed in those areas where bcc-phase-tantalum forming first layer 222 has been removed as described above, and substantially bcc-phase tantalum regions 234 formed over bcc-phase-tantalum forming regions 224. After removal of the photoresist described above and before the tantalum layer 230 is deposited onto the desired regions a cleaning process of the tantalum deposition system is performed. In this embodiment, a thin layer of gold is sputter deposited over the internal walls or surfaces of the sputtering system forming an essentially contamination free environment before each tantalum deposition. In alternate embodiments, the number of gold depositions over the internal walls of the system may be varied, for example, after every other tantalum deposition or after every three tantalum depositions. The particular number will depend on a number of parameters such as the base pressure of the system and the contaminants found in the system.

In addition, the surfaces onto which the tantalum is to be formed are sputter cleaned to remove material adsorbed onto the surface, such as surface oxides, carbon monoxide, oxygen, water, and adventitious carbon before the tantalum deposition is performed. Generally, the first layer surface may be bombarded utilizing argon ions at an argon pressure of 2 to 3 mTorr of argon with a flow rate of about 80 sccm, an applied voltage of about 100 volts and a power of 1 kW. In alternate embodiments, other gases such as helium, neon, krypton, xenon, nitrogen, and mixtures thereof also may be utilized, as well as different pressures, flow rates, applied voltage, and powers. Tantalum layer 230 is subsequently created on the sputter cleaned surfaces. In one embodiment, tantalum layer 230 may be formed by sputter depositing tantalum utilizing an argon pressure of 5 mTorr with a flow rate of 100 sccm of argon and a power of 10 kW. Under these conditions the bcc-phase tantalum regions were determined to be in compressive residual stress. For a 300 nanometer thick tantalum film deposited on a titanium first layer the bcc-phase tantalum compressive residual stress varied from about −650 Mega Pascal (MPa) to about −750 MPa as the titanium thickness varied from about 10 nanometers to about 80 nanometers. For a 300 nanometer thick tantalum film deposited on a niobium first layer the bcc-phase tantalum compressive residual stress varied from about −1529 MPa to about −1025 MPa as the titanium thickness varied from about 2.5 nanometers to about 80 nanometers. For a 300 nanometer thick tantalum film deposited on a aluminum first layer the bcc-phase tantalum compressive residual stress varied from about −1022 MPa to about −908 MPa as the titanium thickness varied from about 10 nanometers to about 80 nanometers. In alternate embodiments, a voltage bias of up to about −550 volts also may be applied to generate a desired compressive residual stress in tantalum layer 230.

In still other embodiments, other conditions that are known in the art to deposit tantalum also may be utilized. For example, in alternate embodiments, a voltage bias of up to about −550 volts also may be applied to generate a desired compressive residual stress in tantalum layer 230. Further, tantalum layer 230 also may be formed utilizing various physical or chemical vapor deposition technologies in addition to sputter deposition. For example, evaporation systems (both thermal and electron beam evaporation), chemical vapor deposition systems (CVD) including atmospheric (APCVD), low pressure (LPCVD), or plasma enhanced (PECVD) variants, as well as other film creating processes such as electroless or electro-deposition and thick film deposition techniques such as screen printing with subsequent high temperature annealing also may be utilized.

In an alternate embodiment, a self-supporting tantalum layer may be formed utilizing a voltage bias applied to the substrate during sputter deposition thereby increasing the compressive stress build up in the tantalum layer. After the desired thickness is achieved the tantalum layer may be removed by using the surface tension of water to peel off the tantalum layer producing a self-supporting sheet containing β phase or non-bcc-phase tantalum regions, and substantially bcc-phase tantalum regions 234 in the same sheet. In still other embodiments, the tantalum layer may be formed over a sacrificial layer which is removed by chemical or solvent attack of the sacrificial layer thereby forming a self-supporting sheet of tantalum containing a combination of bcc and non-bcc-phase tantalum regions. One example of a sacrificial layer that may be utilized is polysilicon using tetra methyl ammonium hydroxide (TMAH) or potassium hydroxide (KOH) as etchants to etch the polysilicon. Another example is to utilize a phosphorus doped spin on glass (SOG), using a buffered oxide etch that is essentially hydrofluoric acid and ammonium chloride may be utilized to etch the SOG while minimizing damage to the tantalum layer. Another example is to form the tantalum layer along with the first layer on a polymer substrate such as polycarbonate or polyimide that may then be either chemically etched or dissolved by an organic solvent such as tetrahydrofuran for a polycarbonate substrate. In still another example an oxygen plasma ashing proccess also may be utilized to remove a polymer substrate.

The bcc-phase tantalum regions 234 formed in tantalum layer 230 have both thermal and electrical conductivities about 10 times higher than the non-bcc-phase tantalum regions 232. These differences in thermal and electrical conductivities provide for increased thermal and electrical transport properties compared to the thermal and electrical transport properties of the non-bcc-phase tantalum regions. In addition, the creation of various patterns or structures of alpha and beta phases of tantalum also provides a means of generating thermal and electrical gradients in the same tantalum layer, both within the film thickness (i.e. vertically as illustrated in FIG. 2c) and laterally on the surface temperature of the tantalum layer. By utilizing tantalum structures having sub-micrometer dimensions thermal and electrical gradients in this length scale may be generated.

Figure 2D:
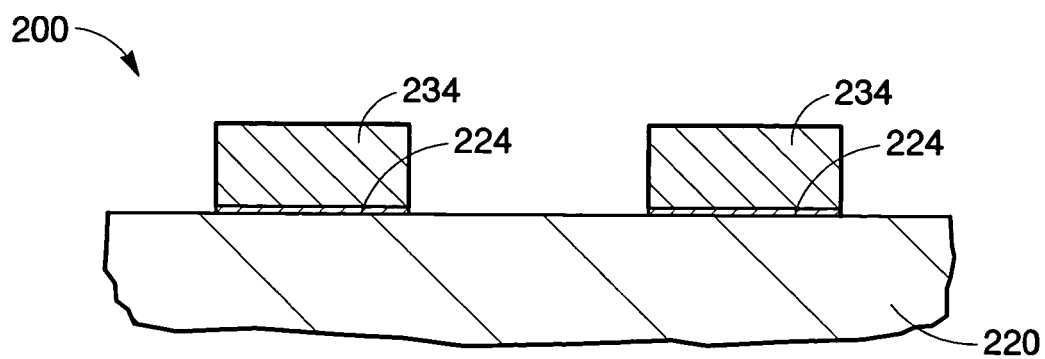

Optional tantalum layer etching process 196 is utilized to etch the tantalum layer to form bcc-phase tantalum regions 234 as illustrated in FIG. 2d. After the tantalum layer has been formed as described above, depending on the particular application in which the apparatus including the tantalum layer is to be utilized, it may be desirable to form well defined bcc-phase tantalum regions. Optional tantalum layer etching process 196 is a maskless etch process and provides for the creation of alpha or bcc-phase tantalum regions 234 that are self-aligned to first structures 224 disposed over second layer 220 of apparatus 200. In this embodiment, β phase or non-bcc-phase tantalum regions 232 may be selectively etched using a chlorine plasma etch leaving behind substantially bcc-phase tantalum regions 234 as shown in FIG. 2d thereby reducing the number of steps utilized to create tantalum regions 234 as well as creating bcc-phase tantalum regions having essentially straight sidewalls. Generally, chlorine gas at a pressure of 15 mTorr with a flow rate of 120 sccm and an RF power of about 400 W applied to the upper electrode and 50 W applied to the lower electrode and a lower electrode temperature of about 50° C. may be utilized. However, in alternate embodiments, other pressures, flow rates, and powers also may be utilized depending on various factors such as the thickness of the tantalum film and the size of the features being etched.

Figure 3:
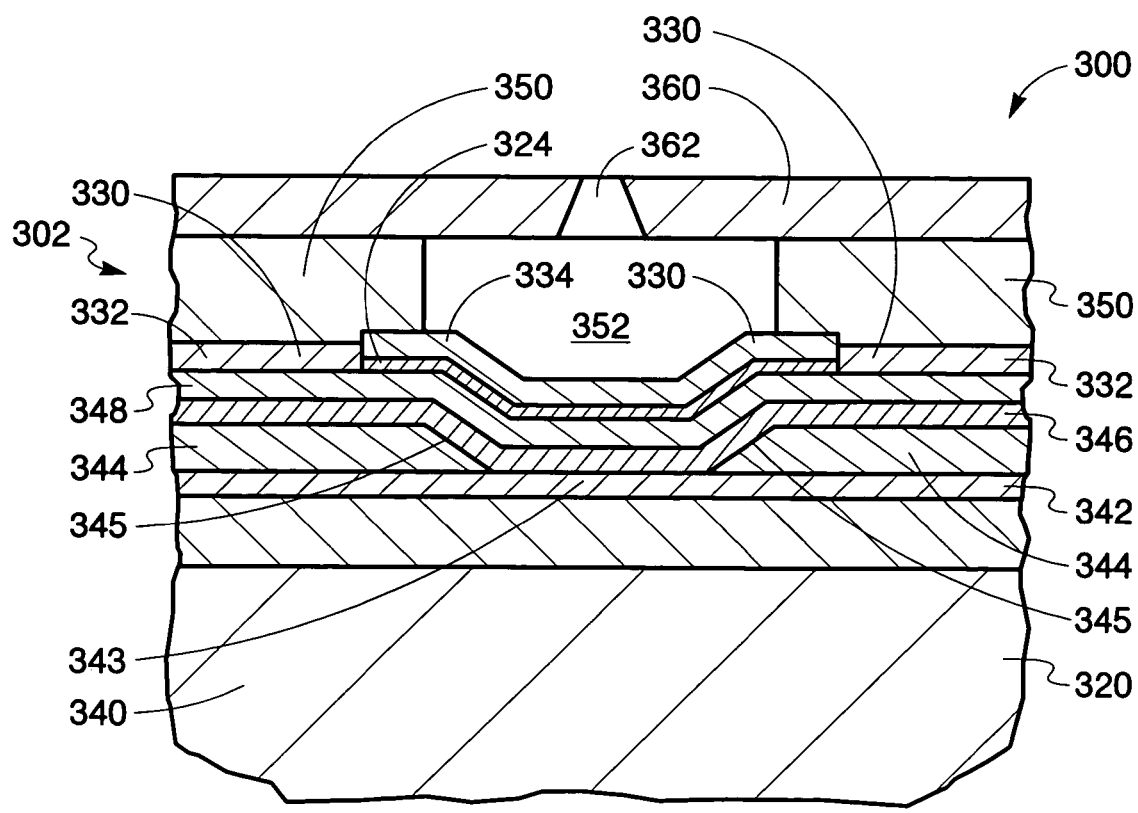
FIG. 3 is a cross-sectional view of an exemplary embodiment of an apparatus utilizing a tantalum layer created according to an embodiment of the present invention.

An exemplary embodiment of the present invention is shown in a cross-sectional view in FIG. 3. In this embodiment, fluid ejector head 300 includes bcc-phase tantalum region 334 providing environmental, mechanical, and electrical protection to resistor 343. In providing environmental and mechanical protection bcc-phase tantalum region 334 provides protection from cavitation when resistor 343 is activated forming a vapor bubble in fluid chamber 352 that rapidly expands expelling a fluid drop through nozzle or orifice 362 and then rapidly collapses back on the surface of bcc-phase tantalum region 334. In this embodiment, substrate 320 is a silicon wafer having a thickness of about 300-700 micrometers. In alternative embodiments, other materials and substrate thicknesses also may be utilized for substrate 320, such as, various glasses, aluminum oxide, polyimide substrates, silicon carbide, and gallium arsenide to name a few.

Accordingly, this embodiment is not intended to be limited to those fluid ejector heads fabricated in silicon semiconductor materials. In addition, optional substrate dielectric layer 340 is a silicon oxide layer disposed on substrate 320. However, in alternate embodiments, other materials also may be utilized, such as metals or polymers, depending on the particular substrate material used and the particular application in which fluid ejector head 300 will be used. In this embodiment, the thickness of substrate dielectric layer is in the range from about 0.40 micrometers to about 0.75 micrometers. However, in alternate embodiments, the thickness of substrate dielectric layer 340 may be in the range from about 0.10 micrometers to about 2 micrometers. In addition, fluid inlet channels (not shown) are formed in fluid ejector head 100 to provide a fluid path between a reservoir (not shown) and fluid ejector actuator 310.

Resistive layer 342, having substantially planar opposed major surfaces, is disposed over substrate dielectric layer 340 and forms resistor 343. In this embodiment, fluid ejector actuator 310 is thermal resistor 343 that utilizes a voltage pulse to rapidly heat a component in a fluid above its boiling. In alternate embodiments, other fluid ejector generators such as piezoelectric, ultrasonic, or electrostatic generators may also be utilized. Resistive layer 340, in this embodiment, is a tantalum aluminum alloy; however, in alternate embodiments, any resistive material capable of generating sufficient heat to rapidly heat a component in the fluid desired to be ejected also may be utilized. For example, resistor alloys such as tungsten silicon nitride, or polysilicon are just a couple of alternate materials that may be utilized. Resistive layer 342, in this embodiment, has a thickness in the range from about 20 nanometers to about 400 nanometers. In alternate embodiments, resistive layer 342 may have other thicknesses depending on various factors such as the particular material utilized to form the resistive layer as well as the size of the resistor and the desired size of the drops ejected. Electrical conductors 344 are disposed over resistive layer 342 and provide the electrical power path to thermal resistor 342. Electrical conductors 344 include beveled edges 345 formed in the area proximate to thermal resistor 342. The beveled edges provide improved step coverage for additional layers formed over thermal resistor 343 and electrical conductors 344. Electrical conductors have a thickness in the range from about 50 nanometers to about 500 nanometers. Electrical conductors 344, in this embodiment, are formed utilizing an aluminum copper silicon alloy. In other alternative embodiments, other interconnect materials commonly used in integrated circuit or printed circuit board technologies, such as other aluminum alloys, gold, or copper, also may be used to form electrical conductors 344 with or without beveled edges 345.

The embodiment shown in FIG. 3 utilizes two dielectric passivation formed over thermal resistor 343 and electrical conductors 344, first dielectric layer 346 disposed on thermal resistor 343 and electrical conductors 344, and second dielectric layer 348 disposed on first dielectric layer 346. In this embodiment, first dielectric layer 346 is a silicon nitride ($Si_xN_y$) layer and second dielectric layer 348 is a silicon carbide ($SiC_x$) layer. However, in alternate embodiments, a single dielectric layer also may be utilized. In addition, a wide variety of dielectric materials may be utilized to form the first and second dielectric layers. For example, silicon oxide ($SiO_x$), boron nitride ($BN_x$), aluminum oxide ($Al_xO_y$), tantalum oxide ($Ta_xO_y$), and high temperature polymers such as polyimide also may be utilized. Fluid ejector head 300 also includes bcc-phase-tantalum forming seed structure 324 disposed on second dielectric layer 348 in the region over fluid ejector actuator 310. Tantalum layer 330 is disposed over bcc-phase-tantalum forming seed structure 324 and those regions of second dielectric layer 348 not covered by seed structure 324. Tantalum layer 330 includes non-bcc-phase tantalum regions 332 formed in those areas where tantalum layer 330 is formed on second dielectric layer 348, and tantalum layer 330 includes substantially bcc-phase tantalum regions 334 where tantalum layer 330 is formed over bcc-phase-tantalum forming seed structure 324. In this embodiment, both the bcc and non bcc-phases of tantalum layer 330 are in compressive stress providing a more uniform stress distribution over substrate 320. Generally, an alpha or bcc-phase tantalum layer is formed in tensile stress, which is typically undesirable. The bcc-phase tantalum regions have a thermal conductivity about 10 times higher than the non-bcc-phase tantalum regions. This difference in thermal conductivity provides for increased thermal efficiency of fluid ejector head 300 by more efficiently coupling the heat generated by thermal resistor 343 to the fluid in contact with bcc-phase tantalum regions 334 formed above the resistors and reduces lateral heat flow along the tantalum layer 330.

As illustrated in FIG. 3 chamber layer 350 is disposed over substrate 320 wherein sidewalls 354 define or form a portion of fluid ejection chamber 352. In this embodiment, chamber layer 350 is formed on tantalum layer 330. However, in alternate embodiments, non-bcc-phase tantalum regions 332 may be etched away as described above and chamber layer 350 formed on the surface onto which the tantalum layer was created (i.e. in this embodiment, second dielectric layer 348). In still other embodiments, chamber layer 350 also may be formed on a silicon carbide layer formed on a silicon nitride layer formed on tantalum layer 330. Nozzle or orifice layer 360 is disposed over chamber layer 350 and contains one or more bores or nozzles 362 through which fluid is ejected. In alternate embodiments, depending on the particular materials utilized for chamber layer 350 and nozzle layer 360 an adhesive layer also may be utilized to adhere nozzle layer 360 to chamber layer 350. Fluid ejection chamber 352 is formed by sidewalls 354, the interior surface of nozzle layer 360, and the exposed surface of bcc-phase tantalum regions 334. In this embodiment, chamber layer 350 is a photoimagible film that utilizes conventional photolithography equipment to form chamber layer 350 and then define and develop fluid ejection chamber 352. In this embodiment, chamber layer 350 has a thickness in the range from about 1 micrometer to about 100 micrometers. Nozzle layer 360 may be formed of metal, polymer, glass, or other suitable material such as ceramic. In one embodiment, nozzle layer 360 is a polyimide film. Examples of commercially available polyimide nozzle layer materials include a polyimide film available from E. I. DuPont de Nemours & Co. under the trademark "Kapton", a polyimide material available from Ube Industries, LTD (of Japan) under the trademark "Upilex." In a second embodiment, nozzle layer 360 is formed from a metal such as a nickel base enclosed by a thin gold, palladium, tantalum, or rhodium layer. In still other embodiments, nozzle layer 360 may be formed from polymers such as polyester, polyethylene naphthalate (PEN), epoxy, or polycarbonate. According to additional embodiments, chamber layer 350 and nozzle layer 360 may be formed utilizing the same material for both layers.

Figure 4:
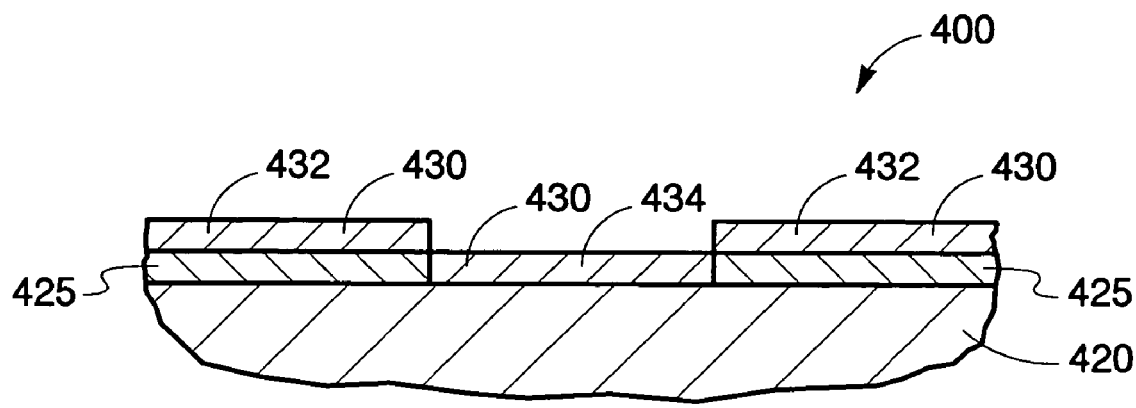
FIG. 4 is a cross-sectional view of an apparatus utilizing a tantalum layer created according to an alternate embodiment of the present invention.

An alternate embodiment of the present invention is shown in a cross-sectional view in FIG. 4. In this embodiment, apparatus 400 includes non-bcc-phase or β-phase tantalum forming seed layer 425 disposed on bcc-phase-tantalum forming substrate 420. Examples of materials that may be utilized to create non-bcc-phase-tantalum forming seed layer 425 are silicon carbide and metal or non-metal oxides. In this embodiment, the substrate is formed utilizing a bcc-phase-tantalum forming material such as niobium, aluminum, titanium, and tantalum nitride. In this embodiment, a seed layer patterning process is utilized to define the location and lateral shape of the β-phase tantalum forming seed layer regions. In this embodiment, a tantalum layer creation process is utilized to create a tantalum layer over the surface exposed regions of the bcc-phase-tantalum forming substrate, and over the patterned non-bcc-phase or β-phase tantalum forming seed layer. Tantalum layer 430 includes β-phase or non-bcc-phase tantalum regions 432 formed in those areas where the β-phase tantalum forming seed layer remains. In addition, tantalum layer 430 also includes bcc-phase tantalum regions 434 formed in those areas where the β-phase tantalum forming seed layer has been removed and the tantalum is deposited directly on bcc-phase-tantalum forming substrate 420.

Figure 5:
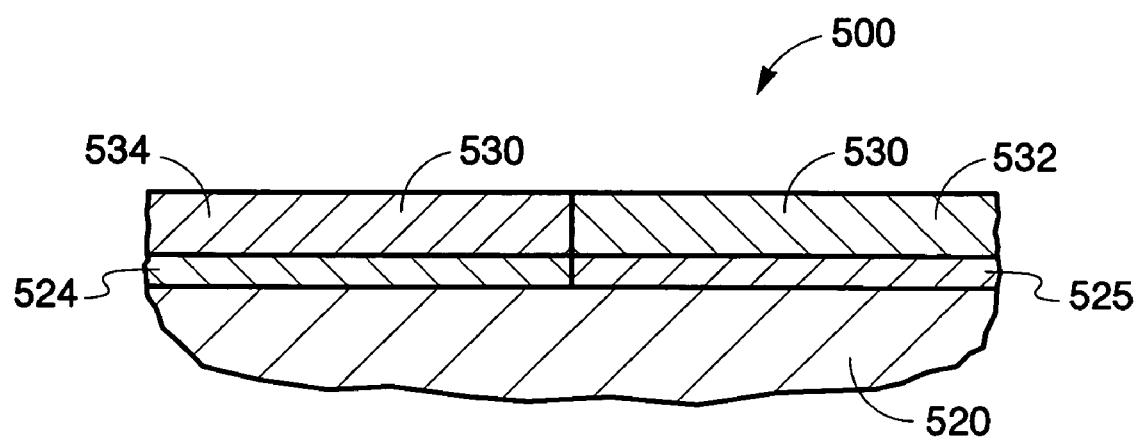
FIG. 5 is a cross-sectional view of an apparatus utilizing a tantalum layer created according to an alternate embodiment of the present invention.

An alternate embodiment of the present invention is shown in a cross-sectional view in FIG. 5. In this embodiment, apparatus 500 includes non-bcc-phase or β-phase tantalum forming structure or region 525 and bcc-phase-tantalum forming structure or region 524 disposed on substrate 520. In this embodiment, regions 525 and 524 are illustrated as having the same thickness; however, in alternate embodiments, the regions may have different thicknesses as well. Tantalum layer 530 includes β-phase or non-bcc-phase tantalum region 532 formed on β-phase tantalum forming region 525. In addition, tantalum layer 530 also includes bcc-phase tantalum region 534 formed on bcc-phase-tantalum forming structure or region 524. In this embodiment, bcc-phase-tantalum forming region 524 may be formed utilizing any of the materials described above such as niobium, titanium, and aluminum. In addition, non-bcc-phase tantalum region 532 may be formed utilizing any material that does not form bcc-phase tantalum and is compatible with the particular processes used to make apparatus 500 and compatible with the environment in which apparatus 500 will be utilized.

Substrate 520 may be formed from a wide range of materials including ceramics, glasses, metals and alloys, various semiconductor materials, and plastics. Examples of substrate materials that may be utilized in this embodiment as well as generally in the present invention include, ceramics such as metal oxides, nitrides, carbides and borides; glasses such as borosilicate, soda lime or quartz glasses (including crystalline and amorphous glasses) as well as silicon oxides, nitrides, and silica mixed with oxides of, for example, potassium, calcium, barium or lead; metals such as all of the transition and alkali metals as well as other metals such as antimony, tin, aluminum, bismuth; semiconductor materials such as silicon, gallium arsenide, indium phosphide, germanium; and plastic and polymeric materials such as polycarbonate, polyester (PET) including polyester based liquid-crystal polymers, polyethylene naphthalate (PEN), polyvinyl chloride, polybutylene terephthalate (PBT), polypropylene (PP), polyethylene (PE), polyurethane, polyamide, polyarylates, polystyrene, polyvinylchloride, polymethylmethacrylate, polyvinyl acetate, vinylchloride/vinylacetate copolymers, acrylic resin, polyacrylonitrile, polyamide, polyketones, polyacrylamide, and other similar materials. In addition, the substrate is not restricted to typical wafer sizes, and may include processing a sheet or film, or a substrate handled in a different form and size than that of conventional wafers or substrates. The actual substrate material utilized will depend on various system components such as the particular environment to which the device or apparatus will be subjected, the presence or absence of active devices on the substrate, the expected lifetime of the apparatus or device as well as the application in which the device or apparatus will be used.

What is claimed is:

1. A method of making a tantalum structure, comprising: creating a tantalum layer disposed on a first layer region of a first layer and on a second layer region of a second layer, wherein said tantalum layer is a substantially bcc-phase tantalum region on said first layer region and said tantalum layer is a non-bcc-phase tantalum region on said second layer region, wherein creating said tantalum layer comprises:
   creating said substantially bcc-phase tantalum region having a compressive residual stress; and
   creating said non-bcc-phase tantalum region having a compressive residual stress.

2. The method in accordance with claim 1, wherein creating said tantalum layer comprises creating said substantially bcc-phase tantalum region in contact with said non-bcc-phase tantalum region.

3. The method in accordance with claim 1, wherein creating said tantalum layer comprises creating said tantalum layer wherein said substantially bcc-phase tantalum region and said non-bcc-phase tantalum region are contiguous and form a continuous tantalum film.

4. The method in accordance with claim 1, further comprising:
   forming said first layer region over a substrate; and
   forming said second layer region over said substrate.

5. The method in accordance with claim 4, wherein forming said first layer region comprises forming a bcc-phase-tantalum forming region disposed over or on said second layer.

6. An apparatus manufactured in accordance with claim 5.

7. The method in accordance with claim 1, further comprising creating said first layer.

8. The method in accordance with claim 7, wherein creating said first layer comprises creating a bcc-phase-tantalum forming first layer as said first layer.

9. The method in accordance with claim 8, wherein creating said bcc-phase-tantalum forming first layer comprises sputter depositing or chemically vapor depositing, or both, said bcc-phase-tantalum forming first layer.

10. The method in accordance with claim 8, wherein creating said bcc-phase-tantalum forming first layer comprises creating said bcc-phase-tantalum forming first layer utilizing a material selected from the group consisting of niobium, aluminum, titanium, tantalum nitride, aluminum nitride, niobium nitride, titanium nitride, and mixtures thereof.

11. The method in accordance with claim 8, wherein creating said bcc-phase-tantalum forming first layer comprises creating said bcc-phase-tantalum forming first layer disposed on a sacrificial layer.

12. The method in accordance with claim 11, further comprising:
   removing said sacrificial layer; and
   forming a free standing tantalum film having bcc-phase tantalum regions and non-bcc-phase tantalum regions.

13. The method in accordance with claim 8, wherein creating said bcc-phase-tantalum forming first layer comprises creating a monolayer bcc-phase-tantalum forming first layer as said bcc-phase-tantalum forming first layer.

14. The method in accordance with claim 8, wherein creating said bcc-phase-tantalum forming first layer comprises depositing said bcc-phase-tantalum forming first layer utilizing a deposition technique selected from the group consisting of sputtering, laser ablation, electron beam evaporation, thermal evaporation, electro-deposition, electroless deposition, chemical vapor deposition, and combinations thereof.

15. The method in accordance with claim 7, wherein creating said first layer comprises creating a bcc-phase-tantalum forming substrate, wherein said second layer is disposed over said bcc-phase-tantalum forming substrate.

16. The method in accordance with claim 15, further comprising depositing said second layer over said bcc-phase-tantalum forming substrate.

17. The method in accordance with claim 16, further comprising:
patterning said second layer; and
forming openings in said second layer exposing regions of said bcc-phase-tantalum forming substrate.

18. The method in accordance with claim 1, further comprising creating said second layer, wherein said second layer is a substrate.

19. The method in accordance with claim 18, further comprising creating said first layer over said substrate.

20. The method in accordance with claim 1, further comprising etching said tantalum layer.

21. The method in accordance with claim 20, wherein etching said tantalum layer comprises selectively etching said non-bcc-phase tantalum region.

22. The method in accordance with claim 21, wherein selectively etching said non-bcc-phase tantalum region comprises selectively etching said non-bcc-phase tantalum region without a mask.

23. The method in accordance with claim 20, further comprising etching said tantalum layer utilizing a chlorine reactive ion plasma etch to selectively etch said non-bcc-phase tantalum region.

24. The method in accordance with claim 1, wherein creating said tantalum layer comprises applying a voltage bias to said first layer.

25. The method in accordance with claim 24, wherein applying said voltage bias comprises applying a voltage bias less than about 550 volts.

26. The method in accordance with claim 1, wherein creating said tantalum layer comprises creating said tantalum layer wherein said substantially bcc-phase tantalum region has a resistivity of about 13 micro-ohm centimeters, and wherein said non-bcc-phase tantalum region has a resistivity of about 220 micro-ohm centimeters.

27. The method in accordance with claim 1, wherein creating said tantalum layer comprises creating said tantalum layer wherein said substantially bcc-phase tantalum region and said non-bcc-phase tantalum region each has a resistivity and said resistivity of said substantially bcc-phase tantalum region is about 10 times less than said resistivity of said non-bcc-phase tantalum region.

28. The method in accordance with claim 1, further comprising cleaning said first layer region before creating said tantalum layer.

29. The method in accordance with claim 28, wherein cleaning said first layer region comprises wet chemically cleaning said first layer region.

30. The method in accordance with claim 28, wherein cleaning said first layer region comprises sputter pre-cleaning said first layer region.

31. The method in accordance with claim 30, wherein sputter pre-cleaning comprises sputter cleaning said first layer region utilizing an inert gas.

32. The method in accordance with claim 31, wherein sputter pre-cleaning comprises sputter cleaning said first layer region utilizing a halogen gas.

33. The method in accordance with claim 1, further comprising creating said second layer.

34. The method in accordance with claim 33, wherein creating said second layer comprises creating a dielectric layer disposed between a substrate and said first layer.

35. The method in accordance with claim 34, wherein creating said dielectric layer comprises:
creating a silicon carbide layer disposed between said substrate and said first layer; and
creating a silicon nitride layer disposed between said substrate and said silicon carbide layer.

36. The method in accordance with claim 1, further comprising creating a resistor layer disposed between a substrate and said first layer.

37. The method in accordance with claim 36, wherein creating said resistor layer comprises creating said resistor layer having a material selected from the group consisting of tantalum aluminum alloys, polycrystalline silicon, tungsten silicon nitride, and mixtures thereof.

38. The method in accordance with claim 36, further comprising creating an electrical conductor electrically coupled to said resistor layer.

39. The method in accordance with claim 1, further comprising creating a chamber layer disposed over said tantalum layer.

40. The method in accordance with claim 39, further comprising forming a fluid ejection chamber in said chamber layer.

41. The method in accordance with claim 39, further comprising creating a nozzle layer disposed over said chamber layer.

42. The method in accordance with claim 41, further comprising forming at least one nozzle in fluid communication with a fluid ejection chamber formed in said chamber layer.

43. An apparatus manufactured in accordance with claim 1.

44. A method of making a fluid ejector head, comprising: creating a tantalum layer disposed on a first layer region of a first layer and on a second layer region of a second layer, wherein said tantalum layer is a substantially bcc-phase tantalum region on said first layer region and said tantalum layer is a non-bcc-phase tantalum region on said second layer region.

45. The method in accordance with claim 1, further comprising:
creating said first layer wherein said first layer is a bcc-phase-tantalum forming substrate; and
depositing a non-bcc-phase-tantalum forming layer on said bcc-phase-tantalum forming substrate.

46. The method in accordance with claim 45, further comprising:
patterning said non-bcc-phase-tantalum forming layer; and
creating openings to said bcc-phase-tantalum forming substrate.

47. The method in accordance with claim 45, wherein said bcc-phase-tantalum forming substrate includes a material selected from the group consisting of niobium, aluminum, titanium, tantalum nitride, aluminum nitride, niobium nitride, titanium nitride, and mixtures thereof.

48. An apparatus, comprising: a tantalum layer having therein a substantially bcc-phase tantalum region contiguous to a non-bcc-phase tantalum region, wherein said substantially bcc-phase tantalum region and said non-bcc-phase tantalum region each have a compressive residual stress.

49. An apparatus, comprising:
a substrate;
a tantalum layer disposed over said substrate; and a bcc-phase-tantalum forming seed region disposed between said substrate and said tantalum layer, said bcc-phase-tantalum forming seed region in contact with said tantalum layer, wherein said tantalum layer forms a substantially bcc-phase tantalum region where said tantalum layer is in contact with said bcc-phase-tantalum forming seed region, and wherein said tantalum layer forms a non-bcc-phase tantalum region where said tantalum layer is not in contact with said bcc-phase tantalum forming seed region, and wherein said substantially bcc-phase tantalum region and said non-bcc-phase tantalum region are both under a compressive residual stress.

50. An apparatus, comprising:
a substrate; and
means for generating a difference in thermal conductivity laterally within an essentially uniformly thick tantalum layer disposed over said substrate; and
means for heating a fluid, said means for heating disposed between said tantalum layer and said substrate.

51. The apparatus in accordance with claim 50, further comprising means for electrically isolating said means for heating.

52. The apparatus in accordance with claim 50, further comprising means for generating a difference in electrical conductivity laterally within said essentially uniformly thick tantalum layer disposed over said substrate.

53. The apparatus in accordance with claim 50 wherein said essentially uniformly thick tantalum layer has an essentially uniform composition.

54. A fluid ejector head, comprising:
a substrate;
a tantalum layer disposed over said substrate, said tantalum layer comprising a substantially bcc-phase tantalum region and a non-bcc-phase tantalum region;
a bcc-phase-tantalum forming seed region disposed between said substrate and said tantalum layer, said bcc-phase-tantalum forming seed region in contact with said tantalum layer, wherein said tantalum layer forms said substantially bcc-phase tantalum region where said tantalum layer is in contact with said bcc-phase-tantalum forming seed region, and wherein said tantalum layer forms said non-bcc-phase tantalum region where said tantalum layer is not in contact with said bcc-phase tantalum forming seed region; and
a heater disposed between said tantalum layer and said substrate.

55. The apparatus in accordance with claim 54, further comprising:
a silicon oxide layer disposed on said substrate, wherein said heater includes a resistive layer disposed on said silicon oxide layer; and
wherein the apparatus further comprises a first dielectric layer disposed over said resistive layer, said bcc-phase-tantalum forming seed region disposed on a portion of said first dielectric layer, said tantalum layer disposed on said dielectric layer and on said bcc-phase-tantalum forming seed region, wherein said non-bcc-phase tantalum layer is formed on said dielectric layer and said substantially bcc-phase tantalum layer is formed on said bcc-phase-tantalum forming seed region.

56. The apparatus in accordance with claim 54, further comprising:
a chamber layer disposed over said tantalum layer, said chamber layer having at least a portion of a chamber formed therein; and
a nozzle layer disposed over said chamber layer, said nozzle layer having at least one nozzle formed therein and in fluid communication with said chamber.

* * * * *